United States Patent
Miki et al.

(10) Patent No.: US 6,833,723 B2
(45) Date of Patent: Dec. 21, 2004

(54) SEMICONDUCTOR DEVICE WITH PHASE COMPARATOR COMPARING PHASES BETWEEN INTERNAL SIGNAL AND EXTERNAL SIGNAL

(75) Inventors: Takeo Miki, Tokyo (JP); Takeshi Hamamoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 269 days.

(21) Appl. No.: 09/906,724

(22) Filed: Jul. 18, 2001

(65) Prior Publication Data

US 2002/0110939 A1 Aug. 15, 2002

(30) Foreign Application Priority Data

Feb. 13, 2001 (JP) ........................... P2001-035274

(51) Int. Cl.[7] .................. G01R 31/02; G01R 31/26
(52) U.S. Cl. ............................. 324/765; 324/763
(58) Field of Search .................. 324/76.39, 76.41, 324/76.77, 76.82, 76.83, 763, 765, 617; 714/733, 744; 331/44

(56) References Cited

U.S. PATENT DOCUMENTS

| | | | | |
|---|---|---|---|---|
| 5,133,064 A | * | 7/1992 | Hotta et al. | 709/400 |
| 5,428,626 A | * | 6/1995 | Frisch et al. | 714/744 |
| 5,473,618 A | * | 12/1995 | Takeshita et al. | 714/733 |
| 5,577,086 A | * | 11/1996 | Fujimoto et al. | 375/376 |
| 5,675,265 A | * | 10/1997 | Yamamori | 327/3 |
| 5,729,151 A | * | 3/1998 | Zoerner et al. | 324/765 |
| 5,973,571 A | * | 10/1999 | Suzuki | 331/17 |
| 6,084,482 A | * | 7/2000 | Nakamura | 331/44 |

FOREIGN PATENT DOCUMENTS

| | | |
|---|---|---|
| JP | 4-194684 | 7/1992 |
| JP | 2000-147068 | 5/2000 |

* cited by examiner

Primary Examiner—Evan Pert
Assistant Examiner—Russell M. Kobert
(74) Attorney, Agent, or Firm—Oblon, Spivak, McClelland, Maier & Neustadt, P.C.

(57) ABSTRACT

A semiconductor chip is provided with a phase comparison circuit (1), in addition to an integrated circuit implementing a normal operation. The phase comparison circuit (1) compares phases between an internal signal (A) of the integrated circuit and an external signal and outputs a monitor signal (MONSIG) expressing the result of this comparison outward from the semiconductor chip. Thus, the phase of the internal signal (A) of the integrated circuit can be directly detected.

7 Claims, 13 Drawing Sheets

SEMICONDUCTOR DEVICE WITH PHASE COMPARATOR COMPARING PHASES BETWEEN INTERNAL SIGNAL AND EXTERNAL SIGNAL

BACKGROUND OF THE INVENTION

1. Field of the Invention

The present invention relates to a semiconductor device having an integrated circuit, and more particularly, it relates to an improvement for enabling direct detection of the phase of an internal signal of the integrated circuit on the outside of the semiconductor device.

2. Description of the Background Art

A generally known semiconductor device having an integrated circuit in a semiconductor chip is so structured as to output an internal signal generated in the integrated circuit to an external device as a monitor signal in response to an externally input mode switching signal. FIG. 20 is a circuit diagram showing part of a conventional semiconductor device having such a structure. When an externally input mode switching signal SMM is active (high in the example shown in FIG. 20), an internal signal is output as a monitor signal through a NAND circuit 90 serving as a logic switch and an inverter 91. The monitor signal is output to bonding pads formed on the semiconductor chip or external pins which are terminals exposed outward from a sealing body. Another known semiconductor device outputs a monitor signal to an NC (Non-Connect) pin among external pins. The mode switching signal SMM has a function of switching the operation mode of the semiconductor device between a normal operation mode implementing the original function of the integrated circuit and a test mode for monitoring the internal signal.

Thus, a semiconductor device directly outputting an internal signal to bonding pads of a semiconductor chip or external pins of the semiconductor device by shifting its operation mode to a test mode has been known in general. Following recent increase in speed and frequency of the integrated circuit, however, it is necessary not only to simply monitor the internal signal but also to control phase difference at a local level in the semiconductor chip. This is because a setup time between two signals is so reduced in response to the increased speed that internal timing in the semiconductor chip must inevitably be settled even if the timing of an external signal is settled. In order to ascertain the operation limit of the integrated circuit, timing accuracy is required not only on the external pins but also in the semiconductor chip. Under such circumstances, awaited is a semiconductor device enabling phase comparison between signals at the internal level of the semiconductor chip.

FIG. 21 is a circuit diagram showing an exemplary circuit employed in an SDRAM (synchronous dynamic RAM). This circuit is so structured as to compare phases between a signal EXTCKE (external clock enable signal) and a signal EXTCLK (external clock signal). The signal EXTCKE is buffered by a clock buffer 92, to thereafter control clocked inverters 94 and 97 as a signal INTCKE (internal clock enable signal). The signal EXTCLK is buffered by a clock buffer 93, passed as a signal INTCLK (internal clock signal) through the clocked inverter 94, a latch formed by two inverters 95 and 96, the clocked inverter 97 and a latch formed by two inverters 98 and 99, and thereafter transmitted to an integrated circuit as an internal signal.

The signal EXTCLK or INTCLK, supplied from a clock generator (not shown) in a constant cycle, is not arbitrarily changeable. On the other hand, the signal EXTCKE or INTCKE is an asynchronous signal arbitrarily changeable in timing with respect to the signal EXTCLK or INTCLK. As shown in a timing chart of FIG. 22, therefore, an internal signal is changed by changing the timing of the signal EXTCKE.

Referring to FIG. 22, the signal EXTCKE is low and the internal signal is undefined at a time t0. A hatched part in FIG. 22 expresses that the value of the internal signal is undefined. The signal EXTCKE goes high at a time T1, and goes low at a time T4. When the signal INTCLK is high between times T2 and T3, the internal signal is also high. When the signal INTCLK goes high after the time T4, however, the signal INTCLK (part denoted by symbol P in FIG. 22) is not reflected on the internal signal. In other words, an operation neglecting the signal INTCLK appears on the integrated circuit when the signal INTCKE is low. Thus, the operation of the integrated circuit varies with the phase relation between the signals INTCLK and INTCKE, and hence the phase difference between the two signals can be indirectly monitored by varying the timing of the signal EXTCKE and investigating the current operation of the integrated circuit.

However, the circuit shown in FIG. 21 is employed in a normal operation mode, and hence phase difference between an arbitrary internal signal and an external signal cannot be monitored with the circuit shown in FIG. 21. Further, the phase difference between two signals can be not directly but only indirectly monitored through the operation of the integrated circuit.

SUMMARY OF THE INVENTION

An object of the present invention is to provide a semiconductor device enabling direct detection of the phase of an internal signal and a method of inspecting this semiconductor device.

According to a first aspect of the present invention, a semiconductor device has M (M≧1) semiconductor substrates, and each of the M semiconductor substrates comprises an integrated circuit, a phase comparison circuit comparing phases between an internal signal generated in the integrated circuit and an external signal input from outside the semiconductor device and outputting the result as a monitor signal and a monitor signal pad for outputting the monitor signal.

The semiconductor device according to the first aspect compares the phases in each semiconductor substrate, whereby precision of the signal phases can be determined in the semiconductor substrate. Therefore, phase difference can be controlled at a local level in the semiconductor substrate. Further, the monitor signal reflecting the phase difference can be extracted outward through the monitor signal pad, whereby the phase difference can be directly monitored.

According to a second aspect of the present invention, a semiconductor device has M (M≧1) semiconductor substrates, and each of the M semiconductor substrates comprises an integrated circuit having a data wire for outputting a data signal, a phase comparison circuit comparing phases between an internal signal generated in the integrated circuit and an external signal input from outside the semiconductor device and outputting the result as a monitor signal and a first drive circuit outputting the monitor signal to the data wire.

The semiconductor device according to the second aspect compares the phases in each semiconductor substrate, whereby precision of the signal phases can be determined in the semiconductor substrate. Therefore, phase difference can be controlled at a local level in the semiconductor substrate. Further, the monitor signal reflecting the phase difference can be extracted outward through the data wire, whereby the phase difference can be directly monitored. In addition, neither pad nor terminal is required for extracting the monitor signal outward.

According to a third aspect of the present invention, the integrated circuit further has a second drive circuit outputting the data signal to the data wire, the phase comparison circuit compares the phases and the first drive circuit outputs the monitor signal to the data wire only when a mode switching signal input from outside the semiconductor device is at a specific value, and the second drive circuit outputs the data signal to the data wire only when the mode switching signal is not at the specific value, in the semiconductor device according to the second aspect.

In the semiconductor device according to the third aspect, the first and second drive circuits so exclusively operate that signal collision can be prevented on the data wire.

According to a fourth aspect of the present invention, the phase comparison circuit compares the phases only when a mode switching signal input from outside the semiconductor device is at a specific value, in the semiconductor device according to the first or second aspect.

In the semiconductor device according to the fourth aspect, the phase comparison circuit operates in response to the mode switching signal, whereby a useless operation can be prevented when no test is executed.

According to a fifth aspect of the present invention, the phase comparison circuit receives one of a single or plurality of input signals received in the integrated circuit as the mode switching signal, in the semiconductor device according to the third or fourth aspect.

In the semiconductor device according to the fifth aspect, the phase comparison circuit receives one of a single or plurality of input signals received in the integrated circuit as the mode switching signal, whereby neither pad nor terminal is required for inputting the mode switching signal.

According to a sixth aspect of the present invention, the phase comparison circuit receives one of a single or plurality of input signals received in the integrated circuit as the external signal, in the semiconductor device according to any one of the first to fifth aspects.

In the semiconductor device according to the sixth aspect, the phase comparison circuit receives one of a single or plurality of input signals received in the integrated circuit as the external signal, whereby neither pad nor terminal is required for inputting the external signal.

According to a seventh aspect of the present invention, each of the M semiconductor substrates further comprises a selection circuit selecting one of a plurality of signals generated in the integrated circuit in response to a selection signal and inputting the same in the phase comparison circuit as the internal signal in the semiconductor device according to any one of the first to sixth aspects.

The semiconductor device according to the seventh aspect comprises the selection circuit, whereby one of a plurality of internal signals can be freely selected as the object of phase comparison.

According to an eight aspect of the present invention, the selection circuit receives at least part of a single or plurality of input signals received in the integrated circuit as the selection signal, in the semiconductor device according to the seventh aspect.

In the semiconductor device according to the eighth aspect, the selection circuit receives at least part of a single or plurality of input signals received in the integrated circuit as the selection signal, whereby neither pad nor terminal is required for inputting the selection signal.

According to a ninth aspect of the present invention, the selection circuit receives a signal obtained by converting at least part of a single or plurality of input signals received in the integrated circuit as the selection signal, in the semiconductor device according to the seventh aspect.

In the semiconductor device according to the ninth aspect, the selection circuit receives the signal obtained by converting at least part of a single or plurality of input signals received in the integrated circuit as the selection signal, whereby neither pad nor terminal is required for inputting the selection signal.

According to a tenth aspect of the present invention, the semiconductor device according to the first aspect further comprises a sealing body sealing the M semiconductor substrates and a monitor signal terminal electrically connected to the monitor signal pad belonging to each of the M semiconductor substrates and exposed outward from the sealing body.

The semiconductor device according to the tenth aspect comprises the monitor signal terminal, whereby the monitor signal can be externally input in the semiconductor device as a product sealed with the sealing body.

According to an eleventh aspect of the present invention, each of the M semiconductor substrates further comprises a mode switching signal pad receiving the mode switching signal, in the semiconductor device according to the third or fourth aspect.

The semiconductor device according to the eleventh aspect comprises the mode switching signal pad, whereby the mode switching signal can be readily input through the pad.

According to a twelfth aspect of the present invention, the semiconductor device according to the eleventh aspect further comprises a sealing body sealing the M semiconductor substrates and a mode switching signal terminal electrically connected to the mode switching signal pad belonging to each of the M semiconductor substrates and exposed outward from the sealing body.

The semiconductor device according to the twelfth aspect comprises the mode switching signal terminal, whereby the mode switching signal can be externally input in the semiconductor device as a product sealed with the sealing body.

According to a thirteenth aspect of the present invention, each of the M semiconductor substrates further comprises an external signal pad receiving the external signal in the semiconductor device according to any one of the first to fifth aspects.

The semiconductor device according to the thirteenth aspect comprises the external signal pad, whereby the external signal can be readily input through the pad.

According to a fourteenth aspect of the present invention, the semiconductor device according to the thirteenth aspect further comprises a sealing body sealing the M semiconductor substrates and an external signal terminal electrically connected to the external signal pad belonging to each of the M semiconductor substrates and exposed outward from the sealing body.

The semiconductor device according to the fourteenth aspect comprises the external signal terminal, whereby the external signal can be externally input in the semiconductor device as a product sealed with the sealing body.

According to a fifteenth aspect of the present invention, each of the M semiconductor substrates further comprises a selection signal pad receiving the selection signal, in the semiconductor device according to the seventh aspect.

The semiconductor device according to the fifteenth aspect comprises the selection signal pad, whereby the selection signal can be readily input through the pad.

According to a sixteenth aspect of the present invention, the semiconductor device according to the fifteenth aspect further comprises a sealing body sealing the M semiconductor substrates and a selection signal terminal electrically connected to the selection signal pad belonging to each of the M semiconductor substrates and exposed outward from the sealing body.

The semiconductor device according to the sixteenth aspect comprises the selection signal terminal, whereby the selection signal can be externally input in the semiconductor device as a product sealed with the sealing body.

According to a seventeenth aspect of the present invention, M is greater than or equal to 2 in the semiconductor device according to any one of the first to sixteenth aspects.

The semiconductor device according to the seventeenth aspect comprises a plurality of semiconductor substrates, whereby a phase shifting of the internal signals can be measured between the plurality of semiconductor substrates.

According to an eighteenth aspect of the present invention, a method of inspecting a semiconductor device comprises steps of (a) preparing the semiconductor device according to any one of the first to sixteenth aspects and (b) inspecting the semiconductor device prepared in the step (a) by operating the phase comparison circuit belonging to each of the M semiconductor substrates.

In the method according to the eighteenth aspect, the semiconductor device can be inspected by operating the phase comparison circuit. The phases are compared in each semiconductor substrate, whereby precision of the signal phases can be determined in the semiconductor substrate. Therefore, phase difference can be controlled at a local level in the semiconductor substrate. Further, the monitor signal reflecting the phase difference can be extracted outward through the monitor signal pad or the data wire, whereby the phase difference can be directly monitored.

According to a nineteenth aspect of the present invention, the step (b) comprises steps of (b-1) measuring the signal width of the internal signal of the integrated circuit belonging to each of the M semiconductor substrates and (b-2) comparing the signal width with a standard value thereby sorting out the semiconductor device, in the method of inspecting a semiconductor device according to the eighteenth aspect.

In the method according to the nineteenth aspect, a semiconductor device can be sorted out, reflecting the degree of its operating speed, on the basis of the signal width of the internal signal through the characteristics of the semiconductor device according to the present invention.

According to a twentieth aspect of the present invention, M is greater than or equal to 2, and the step (b) comprises a step (b-1) of measuring a phase shift of the internal signal between the M semiconductor substrates, in the method of inspecting a semiconductor device according to the eighteenth aspect.

In the method according to the twentieth aspect, a phase shifting of the internal signals can be measured between the plurality of semiconductor substrates due to the characteristics of the semiconductor device according to the present invention having a plurality of semiconductor substrates, thereby contributing to evaluation of the semiconductor device or control of the phase difference.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1
(Phase Comparison Circuit)

Figure 1:
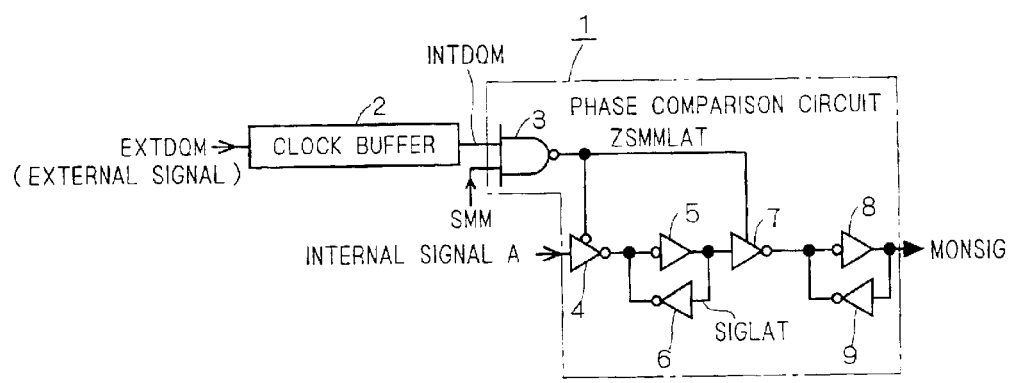
FIG. 1 is a circuit diagram of a phase comparison circuit according to an embodiment 1 of the present invention.

A semiconductor device according to an embodiment 1 of the present invention comprises a phase comparison circuit 1 shown in FIG. 1 in a semiconductor chip (semiconductor substrate), in addition to an integrated circuit for a normal operation. The phase comparison circuit 1 compares phases between an internal signal A generated in the integrated circuit and an external signal externally input in the semiconductor device when an externally input mode switching signal SMM is at a value indicating a test mode, i.e., at an active level, and outputs the result of the comparison as a monitor signal MONSIG. Referring to FIG. 1, the semiconductor device is an SDRAM, and the external signal is an external data mask signal EXTDQM. The internal signal A, generated in an arbitrary portion of the integrated circuit, is subjected to phase detection.

The external signal EXTDQM is buffered by a clock buffer 2 and thereafter input in a NAND circuit 3, serving as a logic switch, as a signal INTDQM (internal data mask signal). When the externally input mode switching signal SMM is active (high in FIG. 1), the signal INTDQM is passed through the NAND circuit 3 and output as a signal ZSMMLAT. The signal ZSMMLAT controls clocked inverters 4 and 7. The internal signal A is successively passed through the clocked inverter 4, a latch formed by two inverters 5 and 6, the clocked inverter 7 and a latch formed by two inverters 8 and 9 and output as the monitor signal MONSIG. The monitor signal MONSIG is output to bonding pads provided on a semiconductor chip (not shown).

Figure 2:
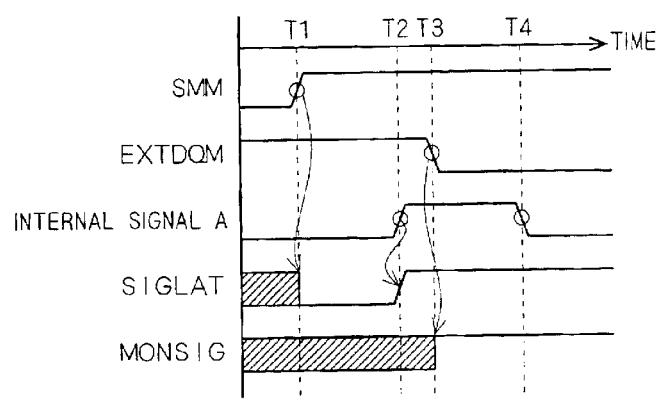
FIGS. 2 and 3 are operation waveform diagrams of a semiconductor device according to the embodiment 1.
Figure 3:
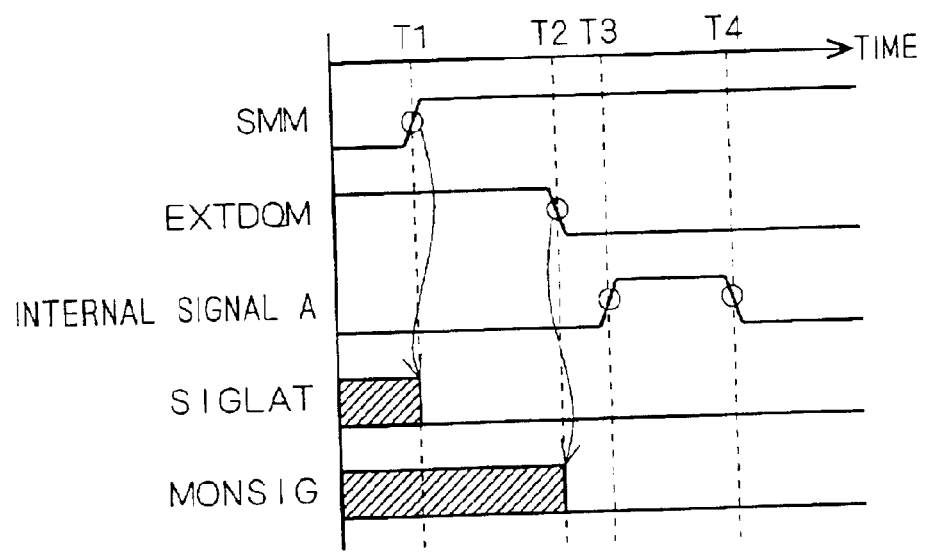

FIGS. 2 and 3 are timing charts showing operations of the phase comparison circuit 1. The phase comparison circuit 1 compares the phases without hindering the normal operation of the integrated circuit. While the phase of the external signal EXTDQM is asynchronously changed in the phase comparison to exert influence on a data mask operation of the integrated circuit based on the external signal EXTDQM, an operation of reading/writing a data signal is performed identically to the normal operation. In each of the timing charts shown in FIGS. 2, 3, 8 and 9, hatched parts express that the values of signals are undefined.

The external signal EXTDQM has different phases in FIGS. 2 and 3. The exemplary operation shown in FIG. 2 is first described. At a time T1, the mode switching signal SMM is activated so that the phase comparison circuit 1 starts comparing the phases. It is assumed that the external signal EXTDQM is high at this time. After the time T1, the signals INTDQM and SMM go high and hence the signal ZSMMLAT goes low. Consequently, the internal signal A is reflected on a signal SIGLAT (latch signal). In other words, the signal SIGLAT goes low.

At a time T2, the internal signal A goes high, and hence the signal SIGLAT also goes high. At a time T3, the signal EXTDQM goes low. Consequently, the signal ZSMMLAT goes high and hence the internal signal A cannot be passed through the clocked inverter 4 and not reflected on the signal SIGLAT. At the same time, the signal SIGLAT is passed through the clocked inverter 7 and reflected on the monitor signal MONSIG. In other words, the monitor signal MONSIG goes high. At a time T4, the internal signal A goes low but cannot be passed through the clocked inverter 4, and hence the monitor signal MONSIG remains high.

Thus, when the trailing edge of the external signal EXTDQM lags the time T2 corresponding to the leading edge of the internal signal A, the monitor signal MONSIG goes high. When the trailing edge of the external signal EXTDQM precedes the time T2, on the other hand, the monitor signal MONSIG goes low as shown in FIG. 3. Therefore, the phase difference between the external signal EXTDQM and the internal signal A can be recognized by measuring the time of level transition of the monitor signal MONSIG.

(Additional Remarks)

The phase comparison circuit 1 directly detecting the phase difference between the signal INTDQM and the internal signal A also directly or indirectly detects the phase difference between the external signal EXTDQM and the internal signal A since the phase difference between the external signal EXTDQM and the signal INTDQM is zero or constant. In the present invention, the expression "comparison of phases between external and internal signals" also includes such indirect comparison. In other words, the expression "comparison of phases between external and internal signals" also includes comparison of phases between a signal obtained by delaying or inverting the external signal and the internal signal.

(Semiconductor Device)

Figure 4:
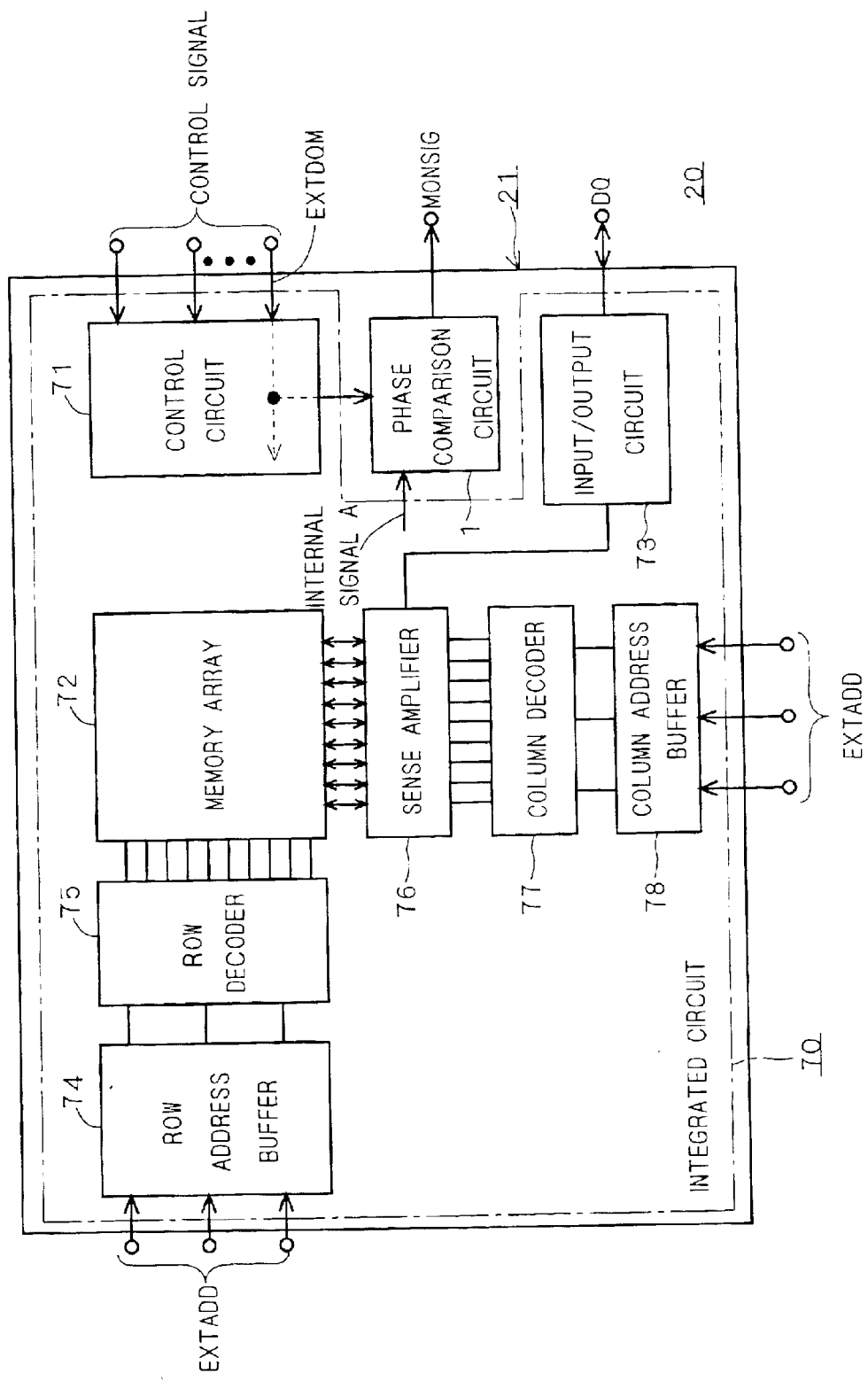
FIG. 4 is a block diagram of the semiconductor device according to the embodiment 1.

FIG. 4 is a block diagram showing an exemplary semiconductor device 20 comprising the phase comparison circuit 1. According to this example, the semiconductor device 20 is structured as an SDRAM. The semiconductor device 20 comprises a semiconductor chip (semiconductor substrate) 21, which is provided with an integrated circuit 70 for implementing a normal operation of the semiconductor device 20 and the phase comparison circuit 1. The phase comparison circuit 1, provided in the semiconductor chip 21, itself partially forms an integrated circuit developed in the semiconductor chip 21. In order to distinguish the phase comparison circuit 1 from the integrated circuit 70 for the normal operation, the remaining part of the overall integrated circuit developed in the semiconductor chip 21 excluding the phase comparison circuit 1 is expressed as the integrated circuit 70.

The integrated circuit 70, which is a generally known circuit, comprises a control circuit 71, a memory array 72, an input/output circuit 73, a row address buffer 74, a row decoder 75, a sense amplifier 76, a column decoder 77 and a column address buffer 78 in order to implement the operation of the SDRAM. Control signals are input in the control circuit 71. The external signal EXTDQM is part of a plurality of control signals. External address signals EXTADD are input in the row address buffer 74 and the column address buffer 78. A data signal DQ is transferred between the input/output circuit 73 and an external device. The internal signal A generated in the integrated circuit 70 is input in the phase comparison circuit 1 while the external signal EXTDQM is input therein through the control circuit 71. The phase comparison circuit 1 outputs the monitor signal MONSIG to the external device.

Figure 5:
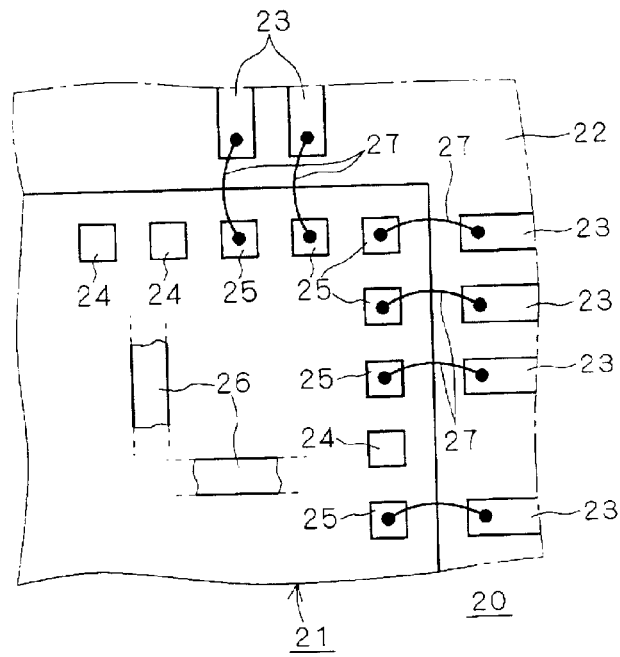
FIG. 5 is an internal plan view of the semiconductor device according to the embodiment 1.

FIG. 5 is a plan view schematically illustrating the internal structure of the semiconductor device 20 around the semiconductor chip 21. As shown in FIG. 5, the semiconductor device 20 may further comprise a sealing body 22 sealing the semiconductor chip 21 and external pins (terminals) 23 electrically connected to the semiconductor chip 21 and exposed outward from the sealing body 22. The sealing body 22 is a resin sealing body, for example. Bonding pads 24 and 25 electrically connected to the integrated circuit 70 and the phase comparison circuit 1 are arranged on the semiconductor chip 21. As shown in FIG. 5, the bonding pads 24 and 25 may include two types of bonding pads, i.e., the bonding pads 25 electrically connected with the external pins 23 and the bonding pads 24 not connected with the external pins 23. The bonding pads 25 are electrically connected to the external pins 23 through bonding wires 27, for example.

The monitor signal MONSIG may be output to the bonding pads 24, or may be output to the external pins 23 through the bonding pads 25. In the latter case, the internal signal A can be monitored also after the semiconductor chip 21 is sealed with the sealing body 22, i.e., also as to the semiconductor device 20 as a completed product. In other words, phase comparison at a product level is enabled.

An external signal is input in the phase comparison circuit 1 through the external pins 23 and the bonding pads 25 when the same is one of signals input in the integrated circuit 70 as control signals likewise the external signal EXTDQM.

Therefore, the external signal for phase comparison can be input also in the semiconductor device 20 as a completed product. Further, such an advantage can be obtained that no specific bonding pads 25 and external pins 23 may be provided for inputting the external signal.

In general, the external signal input in the phase comparison circuit 1 may be a signal other than that input in the integrated circuit 70. In other words, a signal unnecessary for the operation of the integrated circuit 70 but externally input exclusively for the purpose of monitoring the phase of the internal signal A through the phase comparison circuit 1 may be input in the phase comparison circuit 1. In this case, phase comparison can be advantageously executed without influencing the normal operation of the integrated circuit 70. In this case, an input path for the external signal may be connected to none of the bonding pads 24 and 25 but the external signal may be input in the phase comparison circuit 1 by bringing a jig such as a probe, for example, into contact with wires 26 formed on the semiconductor chip 21. Alternatively, the input path for the external signal may be connected to the bonding pads 24 so that the external signal can be input from the bonding pads 24. Further alternatively, the input path for the external signal may be connected to the external pins 23 through the bonding pads 25 so that the external signal can be input through the external pins 23 also after the semiconductor device 20 is completed as a product. In this case, it is also possible to employ NC pins as the external pins 23.

An input path for the mode switching signal SMM may also be provided in various modes similarly to that for the external signal. In other words, the input path for the mode switching signal SMM may be connected to none of the bonding pads 24 and 25 but the mode switching signal SMM may be input in the phase comparison circuit 1 by bringing a jig such as a probe, for example, into contact with the wires 26 formed on the semiconductor chip 21. Alternatively, the input path for the mode switching signal SMM may be connected to the bonding pads 24 so that the mode switching signal SMM can be input from the bonding pads 24. Further alternatively, the input path for the mode switching signal SMM may be connected to the external pins 23 through the bonding pads 25 so that the mode switching signal SMM can be input through the external pins 23 also after the semiconductor device 20 is completed as a product. Also in this case, it is also possible to employ NC pins as the external pins 23.

Further, signals (for example, the control signals or the external address signals EXTADD) input in the integrated circuit 70 may be partially employed as the mode switching signal SMM. The semiconductor device 20 can be so structured that the phase comparison circuit 1 starts phase comparison by the values of these signals or combination of the values of these signals. Also in this case, the mode switching signal SMM for phase comparison can be input in the semiconductor device 20 as a completed product. Further, such an advantage can be obtained that no specific bonding pads 25 and external pins 23 may be provided for inputting the mode switching signal SMM.

In the semiconductor device 20 according to this embodiment, the phases are compared with each other in the semiconductor chip 21 whichever one of the aforementioned modes is employed, whereby precision of the signal phases can be determined in the semiconductor chip 21. Therefore, the phase difference can be controlled at a local level in the semiconductor chip 21. Further, the monitor signal MONSIG reflecting the phase difference can be extracted outward through the pads 24 or 25, whereby the phase difference can be directly monitored.

Particularly when a signal (e.g. the external signal EXTDQM) input in the integrated circuit 70 is employed as the external signal, the phases of the external signal and the internal signal A can be compared with each other in a portion of the integrated circuit 70 adjacent to a circuit part performing operation or the like with using both of the external signal and the internal signal A among circuit parts forming the integrated circuit 70. Thus, the phase difference can be controlled with high precision at the level of this circuit part.

Embodiment 2.

Figure 6:
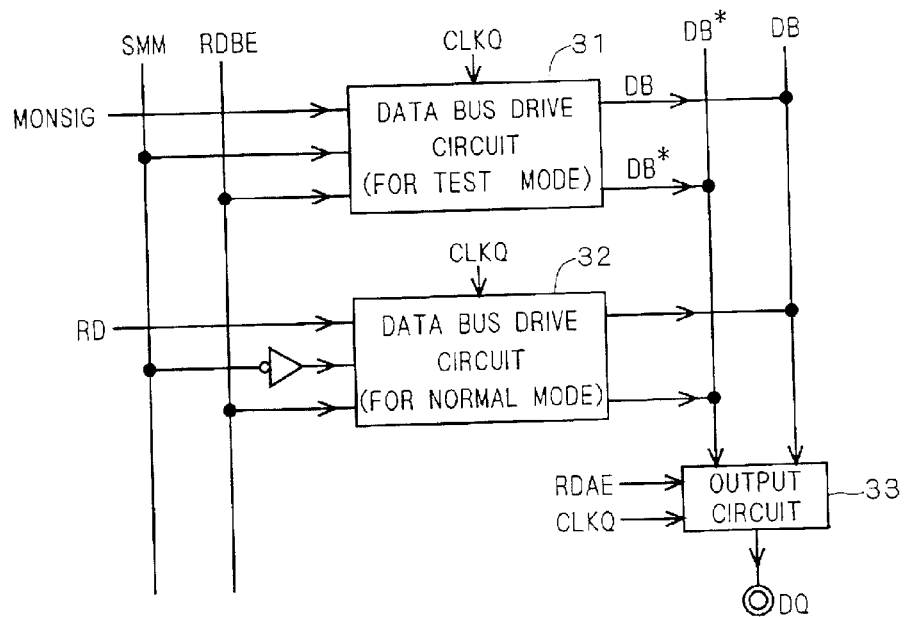
FIG. 6 is a block diagram of a semiconductor device according to an embodiment 2 of the present invention.

A semiconductor device according to an embodiment 2 of the present invention outputs a monitor signal MONSIG to an external device through a path for outputting data from an integrated circuit for a normal operation. FIG. 6 is a block diagram showing an exemplary semiconductor device having such a structure. This semiconductor device is structured as an SDRAM similarly to the semiconductor device 20 shown in FIG. 4, and comprises data bus drive circuits 31 and 32 outputting data signals DB and DB* to data buses (data wires) and an output circuit 33 in a semiconductor chip 21. Throughout the specification and the drawings, symbol "*" appended to a signal (e.g., "DB* ") indicates that this signal is low-active.

The output circuit 33, which is a generally known circuit, amplifies the data signals DB and DB* in synchronization with a clock signal CLKQ serving as a trigger signal according to an instruction of a signal RDAE (read amplifier enable signal), and outputs the amplified data signals DB and DB* outward as a data signal DQ. The data signal DQ is output through bonding pads 25 and external pins 23 (see FIG. 5). The signal RDAE, generated in an integrated circuit 70 (see FIG. 4) on the basis of a read command signal, instructs the output circuit 33 to amplify the data signals DB and DB* when the same are transmitted to the data buses. The command signal is obtained by decoding combination of input signals such as control signals.

The data drive circuit 31 outputs the monitor signal MONSIG as the data signals DB and DB* in synchronization with the clock signal CLKQ according to instructions of a mode switching signal SMM and a signal RDBE (read data bus enable signal). The signal RDBE is generated in the integrated circuit 70 (FIG. 4) on the basis of the read command signal, similarly to the signal RDAE. The data bus drive circuit 32 outputs read data RD as the data signals DB and DB* in synchronization with the clock signal CLKQ according to the instructions of the mode switching signal SMM and the signal RDBE.

The data bus drive circuit 31 outputs the data signals DB and DB* when the mode switching signal SMM is active, while the data bus drive circuit 32 outputs the data signals DB and DB* when the mode switching signal SMM is normal. Thus, the two data bus drive circuits 31 and 32 selectively operate on the basis of the mode switching signal SMM, whereby the monitor signal MONSIG can be output through an output path for the read data RD provided on the integrated circuit 70 with no interference with the operations of the data bus drive circuits 31 and 32.

Figure 7:
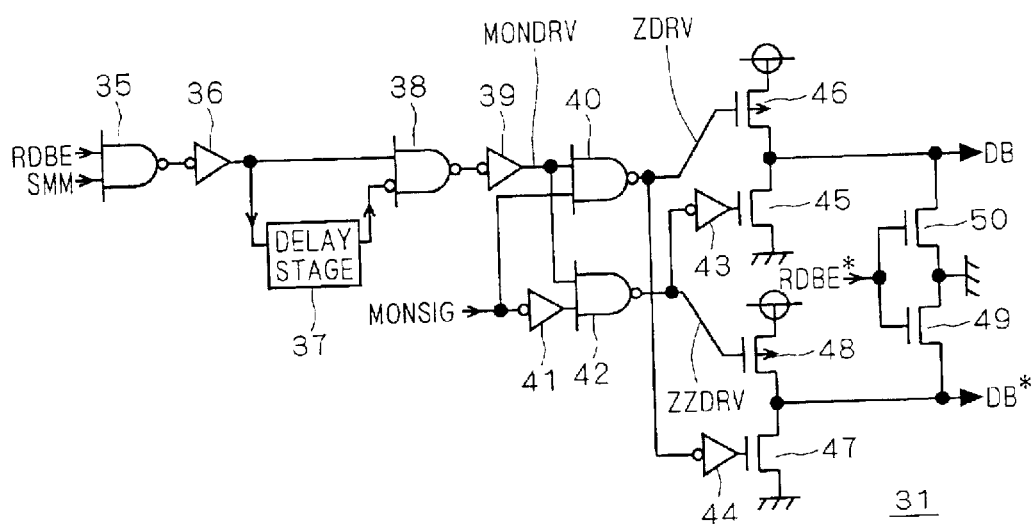
FIG. 7 is a circuit diagram of a drive circuit 31 shown in FIG. 6.

FIG. 7 is a circuit diagram showing the internal structure of the data bus drive circuit 31. A NAND circuit 35 serving as a logic switch passes the signal RDBE when the mode switching signal SMM is active. An inverter 36, a delay stage 37, a NAND circuit 38 and an inverter 39 generate a signal MONDRV as a one-shot pulse on the basis of the signal RDBE passed through the NAND circuit 35. NAND circuits 40 and 42 and inverters 41, 43 and 44 selectively on-off drive MOS transistors 45, 46, 47 and 48 on the basis of the signal MONDRV and the monitor signal MONSIG transmitted from a phase comparison circuit 1 (see FIG. 1). MOS transistors 49 and 50 are turned on/off on the basis of a signal RDBE*.

More in detail, both of the MOS transistors 49 and 50 are turned on when the signal RDBE* is normal (high), and hence both of the data signals DB and DB* go low. When the signal RDBE* is active, the data signals DB and DB* are settled by the signal MONDRV and the monitor signal MONSIG. When the signal MONDRV is normal (low), both of the data signals DB and DB* enter high impedance states. When the signal MONDRV is active, on the other hand, the data signals DB and DB* are settled by the monitor signal MONSIG. The data signals DB and DB* are activated (the data signal DB goes high and the data signal DB* goes low) when the monitor signal MONSIG is active (high), while the data signals DB and DB* are normalized when the monitor signal MONSIG is normal.

The data bus drive circuit 32 is structured equivalently to the data bus drive circuit 31 except a point that the mode switching signal SMM is input in a level-inverted state and a point that a read signal RD is input in place of the monitor signal MONSIG.

Figure 8:
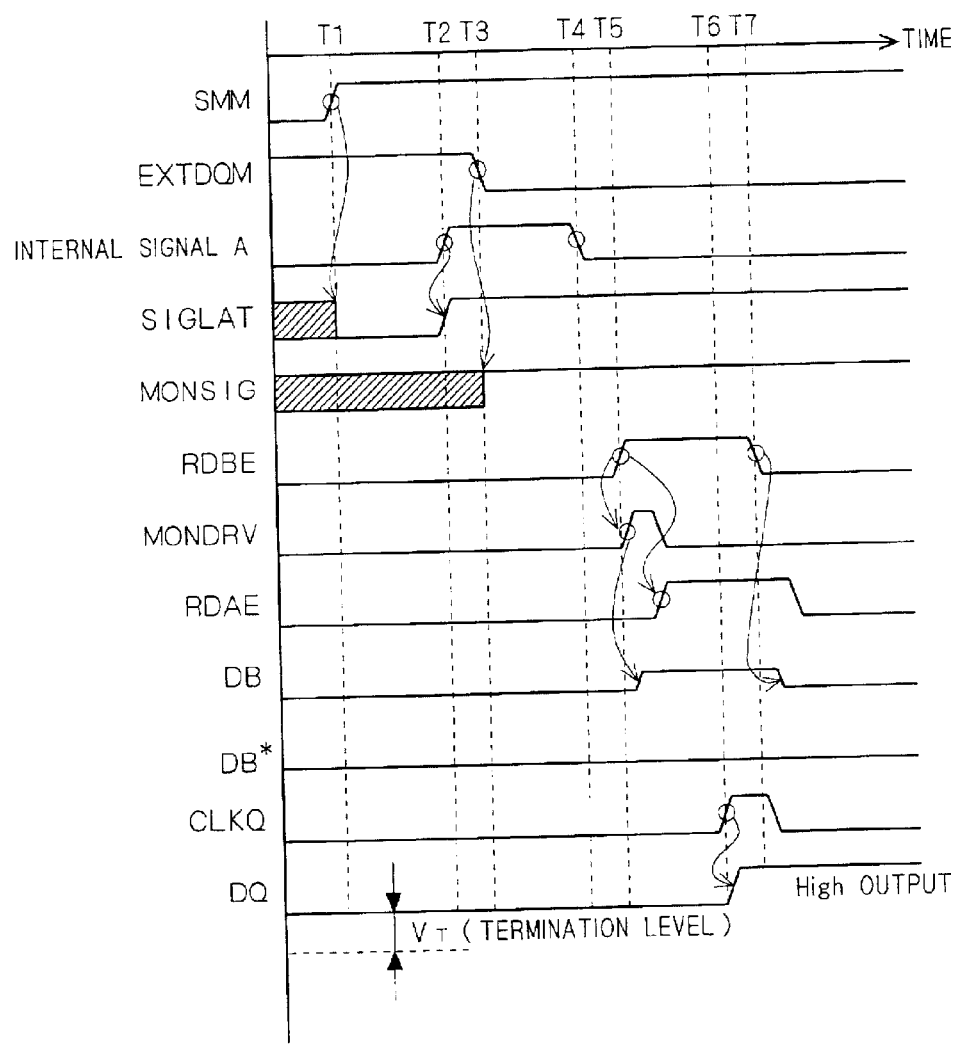
FIGS. 8 and 9 are operation waveform diagrams of the semiconductor device according to the embodiment 2.
Figure 9:
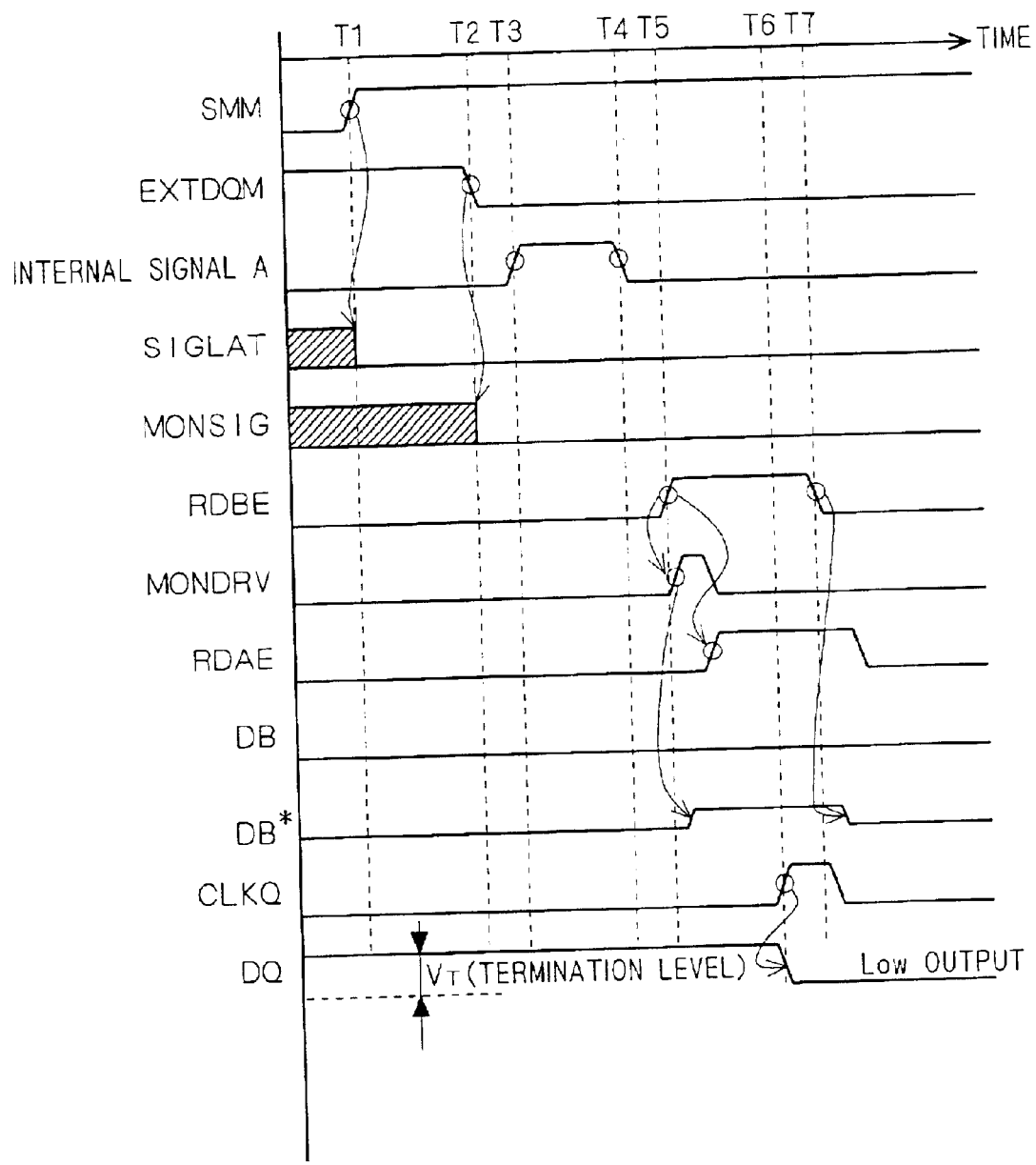

FIGS. 8 and 9 are timing charts showing operations of the data bus drive circuit 31. An external signal EXTDQM has different phases between FIGS. 8 and 9. In relation to the phases of the external signal EXTDQM, FIGS. 8 and 9 are equivalent to FIGS. 2 and 3 respectively. The exemplary operation shown in FIG. 8 is first described. The operation of the phase comparison circuit 1 between times T1 and T4 is equivalent to that shown in FIG. 2.

At a time T5, the signal RDBE is activated. Thus, the signal MONDRV temporarily goes high in the form of a one-shot pulse. At this time, the data signal DB is driven high due to a high level of the signal MONSIG. The data signal DB* remains low. When the signal MONDRV returns to a normal state, an output of the data bus drive circuit 31 enters a high impedance state, while capacitors (not shown) accompany the data buses and hence the values of the data signals DB and DB* remain unchanged up to a time T7 when the signal RDBE returns to a normal state.

After the time T5, the signal RDAE is activated due to the activation of the signal RDBE. Consequently, the output circuit 33 amplifies the data signals DB and DB*. At a time T6, the output circuit 33 outputs the amplified signals DB and DB* as the data signal DQ in synchronization with the leading edge of the clock signal CLKQ. Therefore, a high level is output as the data signal DQ in FIG. 8. Referring to FIG. 8, a termination level $V_T$ indicates a generally known reference value set in the output circuit 33 for the data signal DQ.

The exemplary operation shown in FIG. 9 is now described. The operation of the phase comparison circuit 1 between times T1 and T4 is equivalent to that shown in FIG. 3. At a time T5, the signal RDBE is activated. Thus, the signal MONDRV temporarily goes high in the form of a one-shot pulse. At this time, the data signal DB* is driven high due to a low level of the signal MONSIG. The data signal DB remains low. The values of the data signals DB and DB* remain unchanged up to a time T7 when the signal RDBE returns to a normal state.

After the time T5, the signal RDAE is activated due to the activation of the signal RDBE. Consequently, the output circuit 33 amplifies the data signals DB and DB*. At a time T6, the output circuit 33 outputs the amplified signals DB and DB* as the data signal DQ in synchronization with the leading edge of the clock signal CLKQ. Therefore, a low level is output as the data signal DQ in FIG. 9.

In the semiconductor device according to the embodiment 2, the monitor signal MONSIG is output to the data buses already provided on the integrated circuit 70, whereby no bonding pads 24 and 25 and external pins 23 may be newly provided for outputting the monitor signal MONSIG. Further, the monitor signal MONSIG can be extracted through the external pins 23, whereby phase comparison is enabled not only at a wafer level but also at a product level. This enables confirmation of dispersion (manufacturing dispersion in transistors, wires, contact holes etc.) in finishing of products per lot also after the semiconductor device is completed as a product. In other words, the semiconductor device according to this embodiment is also suitable for evaluation and analysis on the completed product.

Figure 10:
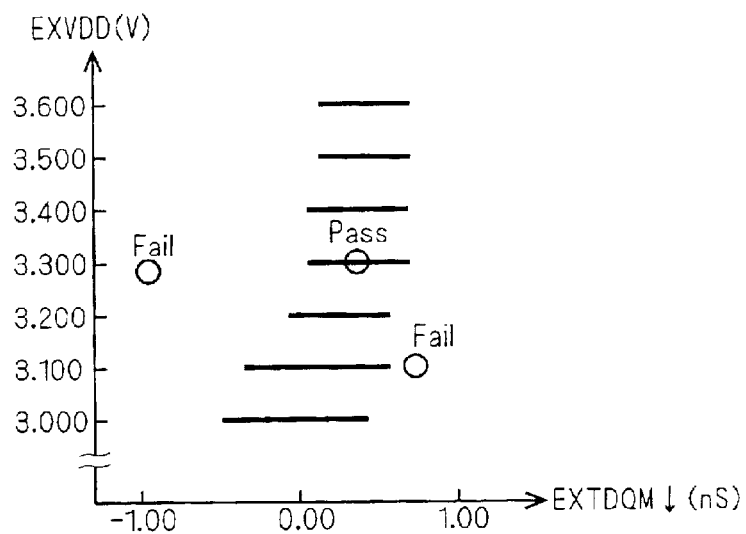
FIG. 10 is a Shmoo plot of the semiconductor device according to the embodiment 2.

FIG. 10 illustrates a graph (Shmoo plot) obtained by plotting pass/fail of phase relation by executing phase comparison on the semiconductor device according to this embodiment. Referring to FIG. 10, the horizontal axis shows deviation from the best time in relation to the trailing edge of the external signal EXTDQM. The vertical axis shows a power supply voltage EXVDD supplied to the semiconductor device. Black strip areas express excellent areas. In other words, FIG. 10 expresses results of phase comparison performed while varying the power supply voltage EXVDD.

Figure 11:
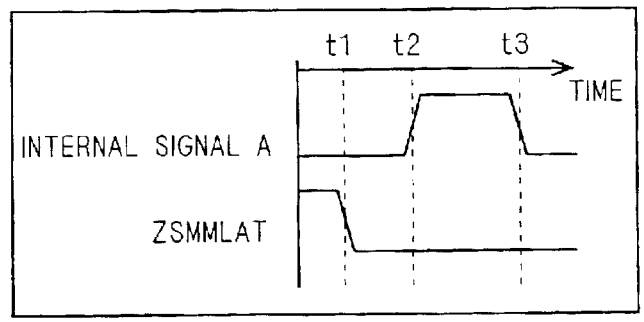
FIGS. 11 to 13 are operation waveform diagrams of the semiconductor device according to the embodiment 2.

The Shmoo plot is obtained by setting a test mode and measuring the monitor signal MONSIG while changing the trailing edge of the external signal EXTDQM from early timing (negative area on the horizontal axis) to late timing (positive area on the horizontal axis), for example. Assuming that a value of the monitor signal MONSIG corresponding to excellent phase relation, i.e., an expected value, is high, a low-level value is obtained as the monitor signal MONSIG if a signal ZSMMLAT falls at a time t1 precedent to period from t2 to t3 when the internal signal A is high as shown in FIG. 11. In other words, the phase relation is determined as defective (fail) in the case shown in FIG. 11.

Figure 12:
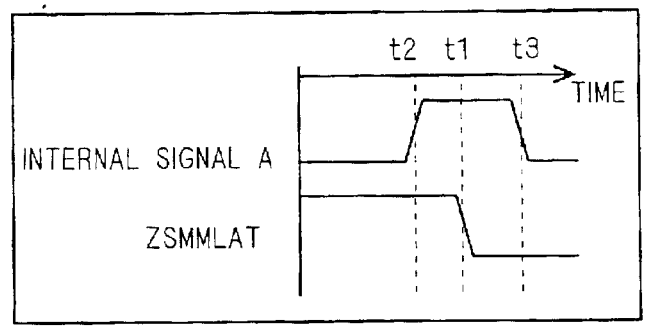
Figure 13:
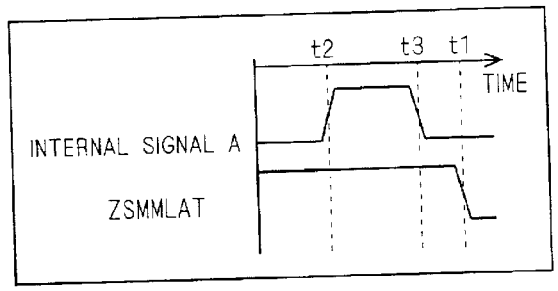

When the signal ZSMMLAT falls at a time t1 within the period from t2 to t3 when the internal signal A is high as shown in FIG. 12, a high-level value is obtained as the monitor signal MONSIG. In other words, the phase relation is determined as non-defective (pass) in the case shown in FIG. 12. When the signal ZSMMLAT falls at a time t1 after the period from t2 to t3 when the internal signal A is high as shown in FIG. 13, a low-level value is obtained as the monitor signal MONSIG. In other words, the phase relation is determined as defective (fail) in the case shown in FIG. 13.

The time width of the area having excellent phase relation can be read from the Shmoo plot illustrated in FIG. 10. This time width corresponds to the signal width (pulse width) of the monitored internal signal A. This signal width varies with process parameters (threshold voltages of transistors, wiring resistance, contact resistance etc.) varying with the lot of products. Therefore, the signal width read from the Shmoo plot can be evaluated on the basis of a previously set reference to be utilized for quality control of products. A preferable procedure is described with reference to an embodiment 5.

The Shmoo plot illustrated in FIG. 10 can be similarly obtained also as to the semiconductor device 20 according to the embodiment 1 by observing the monitor signal MONSIG.

Embodiment 3.

Figure 14:
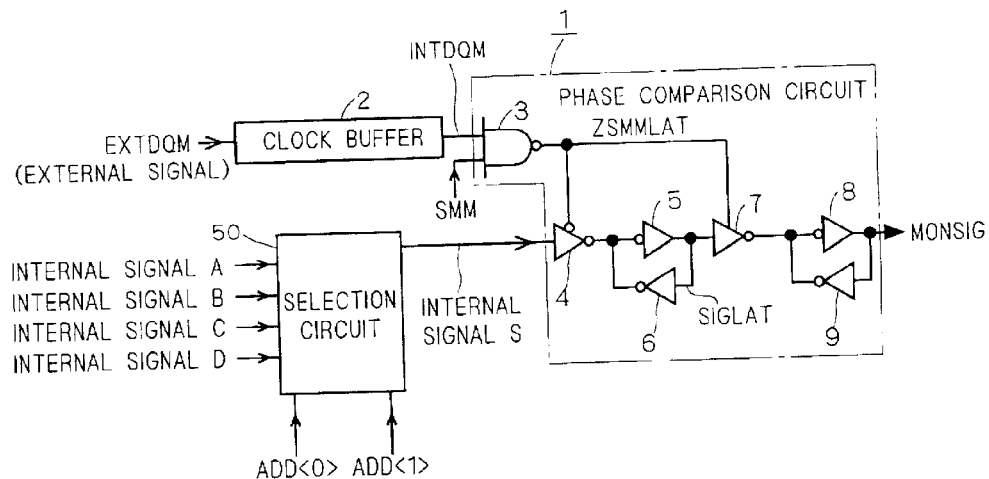
FIG. 14 is a block diagram of a semiconductor device according to an embodiment 3 of the present invention.

A semiconductor device according to an embodiment 3 of the present invention is structured to be capable of freely selecting an arbitrary one from a plurality of internal signals for performing phase comparison thereon. FIG. 14 is a block diagram showing an exemplary semiconductor device having such a structure. This semiconductor device is formed as an SDRAM similarly to the semiconductor device 20 shown in FIG. 4, and comprises a selection circuit 50 in a semiconductor chip 21 in addition to a phase comparison circuit 1. The selection circuit 50 selects one of a plurality of internal signals A to D of an integrated circuit 70 in response to selection signals and inputs the selected signal in the phase comparison circuit 1 as an internal signal S. Referring to FIG. 14, two-bit external address signals EXTADD<0> and EXTADD<1> are input in the selection circuit 50 as the selection signals.

Figure 15:
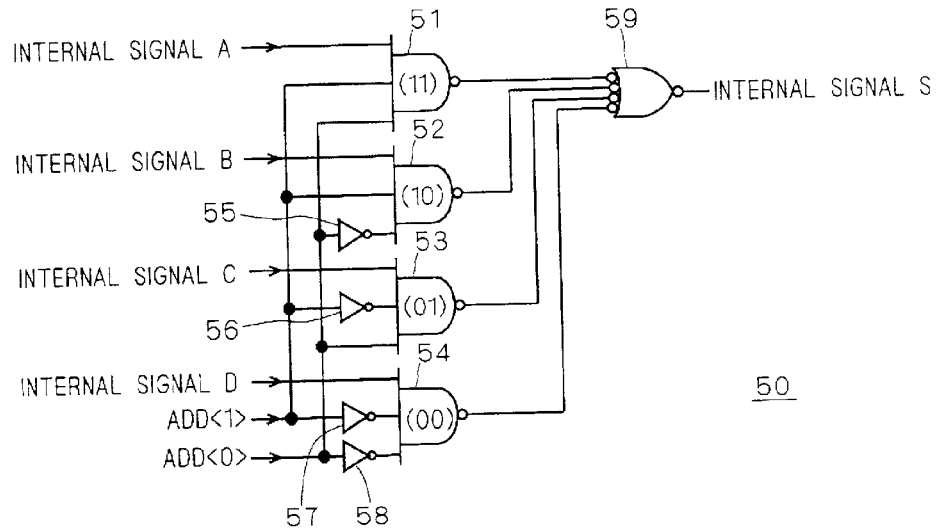
FIG. 15 is a circuit diagram of a selection circuit 50 shown in FIG. 14.

FIG. 15 is a circuit diagram showing an exemplary internal structure of the selection circuit 50. According to this example, the selection circuit 50 comprises NAND circuits 51 to 54, inverters 55 to 58 and a NOR circuit 59. The NAND circuits 51 to 54 receive the internal signals A to D respectively, while receiving the external address signals EXTADD<1> and EXTADD<0> directly or through any of the inverters 55 to 58. Thus, the NAND circuits 51 to 54 selectively pass the internal signals A to D respectively in correspondence to four values "00", "01", "10" and "11" of the two-bit external address signals EXTADD<0> and EXTADD<1>. An internal signal passed through any of the NAND circuits 51 to 54 is passed through the NOR circuit 59 and input in the phase comparison circuit 1 as the internal signal S.

While lower two-bit the external address signals EXTADD<0> and EXTADD<1> are employed as the selection signals in the example shown in FIGS. 14 and 15, the remaining part of external address signals EXTADD can also be employed, as a matter of course. An SDRAM so structured as not to enter a mode for setting a CAS latency (a delay period up to output of a read signal after activation of a column address strobe signal CAS), a burst length (the number of bits of the read signal serially output in a single read operation) and the like unless a one-bit external signal EXTADD<7> is set low in a normal operation mode is generally known. It is also possible to employ the one-bit external signal EXTADD<7> having such a function as a selection signal.

Figure 16:
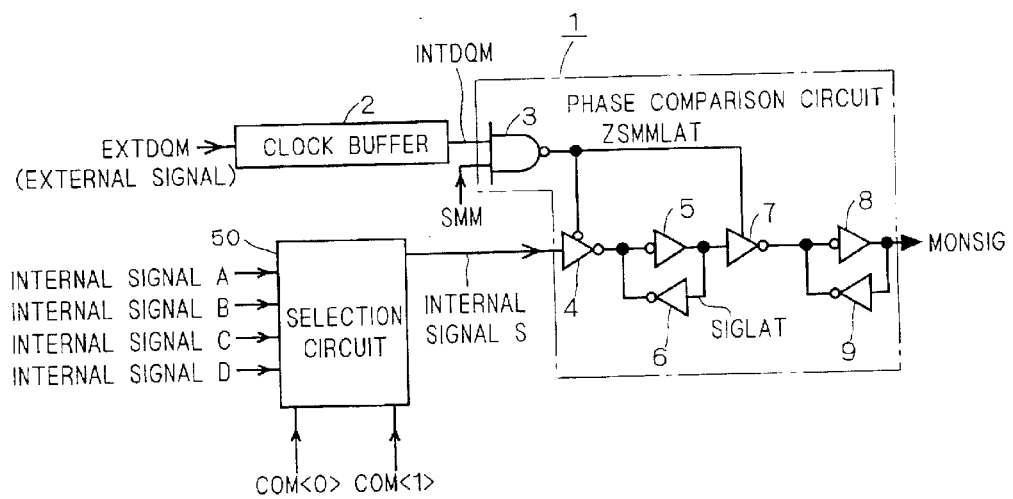
FIG. 16 is a block diagram of another semiconductor device according to the embodiment 3.

Further, it is also possible to employ command signals COM<0> and COM<1> as selection signals, as FIG. 16 shows. The command signals COM<0> and COM<1> are obtained by decoding combination of input signals such as control signals.

In the semiconductor device shown in FIG. 14 or 16, input signals such as external address signals or control signals received in the integrated circuit 70 (see FIG. 4) or command signals obtained by converting the input signals are employed as the selection signals, whereby an internal signal to be subjected to phase comparison can be freely selected for the semiconductor device as a completed product. Further, such an advantage can also be obtained that no specific bonding pads 25 and external pins 23 (see FIG. 5) may be provided for inputting the selection signals.

The selection signals input in the selection circuit 50 may be other than signals input in the integrated circuit 70 in general. In other words, signals unnecessary for operations of the integrated circuit 70 but exclusively externally input for the purpose of selecting an arbitrary one from a plurality of internal signals through the selection circuit 50 may be input in the selection circuit 50 as selection signals. In this case, phase comparison can be advantageously executed without influencing the normal operation of the integrated circuit 70. In this case, further, an input path for the selection signals may be connected to none of bonding pads 24 and 25 but the selection signals may be input in the phase comparison circuit 1 by bringing a jig such as a probe, for example, into contact with wires 26 formed on the semiconductor chip 21. Alternatively, the input path for the selection signals may be connected to the bonding pads 24 so that the selection signals can be input from the bonding pads 24. Further alternatively, the input path for the selection signals may be connected to the external pins 23 through the bonding pads 25 so that the selection signals can be input through the external pins 23 also after the semiconductor device is completed as a product. In this case, it is also possible to employ NC pins as the external pins 23.

Embodiment 4.

Figure 17:
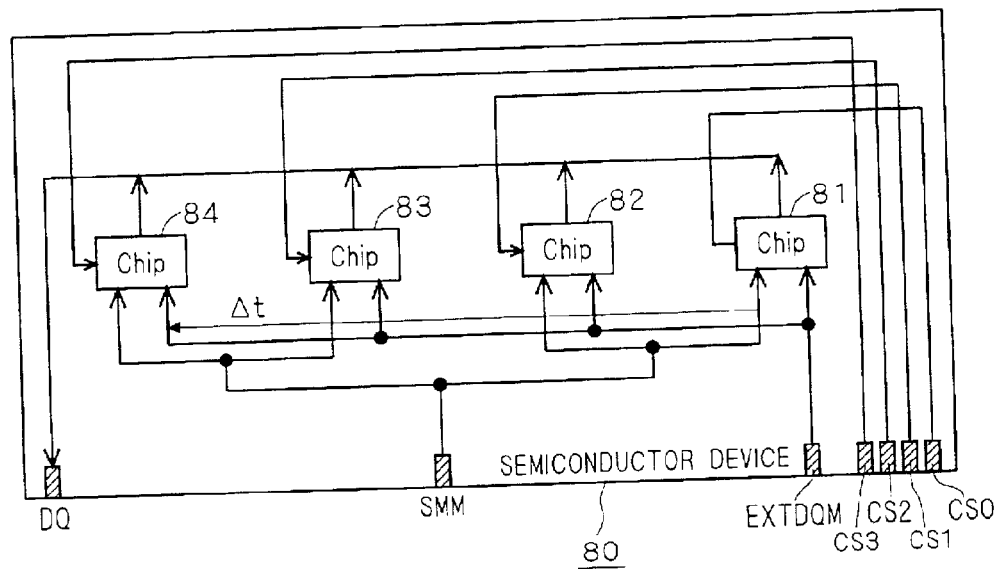
FIG. 17 is a block diagram of a semiconductor device according to an embodiment 4 of the present invention.

A semiconductor device according an embodiment 4 of the present invention comprises a plurality of semiconductor chips (semiconductor substrates), and is so structured that phase difference between internal signals can be sensed among the plurality of semiconductor chips. FIG. 17 is a block diagram showing an exemplary semiconductor device 80 having such a structure. This semiconductor device 80 is structured as a semiconductor module having a plurality of semiconductor chips 81 to 84 set on a substrate. Referring to FIG. 17, each of the semiconductor chips 81 to 84 is structured equivalently to the semiconductor device according to the embodiment 2.

Chip selection signals CS0 to CS3, a signal EXTDQM, a mode switching signal SMM and a data signal DQ are input or output through a plurality of terminals provided on the substrate. The chip selection signals CS0 to CS3 are signals for selectively activating the semiconductor chips 81 to 84. The signal EXTDQM is input in a phase comparison circuit 1 provided in each of the semiconductor chips 81 to 84 as an external signal. The mode switching signal SMM is also input in the phase comparison circuit 1 provided in each of the semiconductor chips 81 to 84. The data signal DQ is output from one of the semiconductor chips 81 to 84 selected through the chip selection signals CS0 to CS3.

Figure 18:
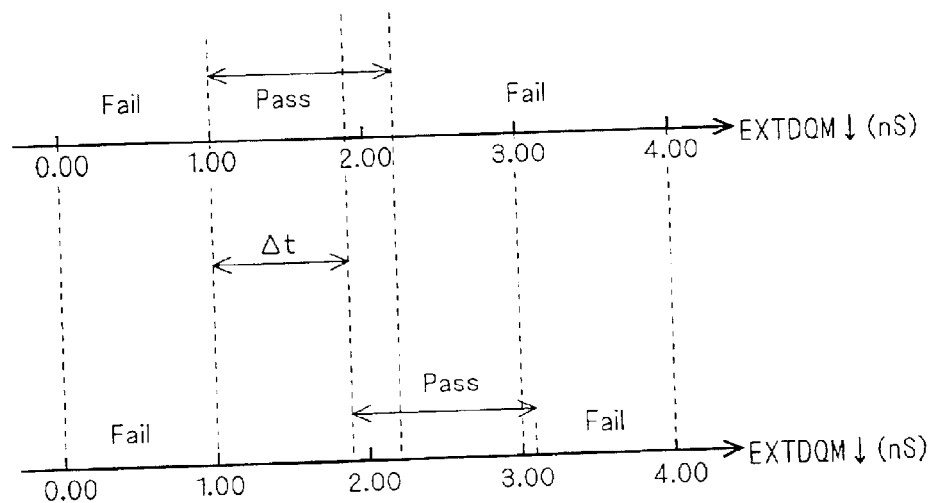
FIG. 18 illustrates Shmoo plots of the semiconductor device according to the embodiment 4.

A method of detecting the phase difference between internal signals of the semiconductor chips 81 and 84 is described, for example. First, the semiconductor chip 81 is activated through the chip selection signal CS0. Then, the method described with reference to the embodiment 2 is carried out on the semiconductor chip 81, thereby detecting the phase difference. Then, the semiconductor chip 84 is activated through the chip selection signal CS3. Then, the method described with reference to the embodiment 2 is carried out on the semiconductor chip 84, thereby detecting the phase difference. Consequently, Shmoo plots are obtained on both of the semiconductor chips 81 and 84, as shown in FIG. 18. Arrows "PASS" in FIG. 18 show ranges presenting excellent phase relation.

It is understood from the two Shmoo plots that deviation Δt takes place in the ranges having excellent phase relation between the two semiconductor chips 81 and 84. This deviation Δt corresponds to deviation between the semiconductor chips 81 and 84 in relation to the phases of internal signals subjected to phase comparison. Thus, the semiconductor chip 80 can measure phase shifting between internal signals among a plurality of semiconductor chips.

Embodiment 5.

Figure 19:
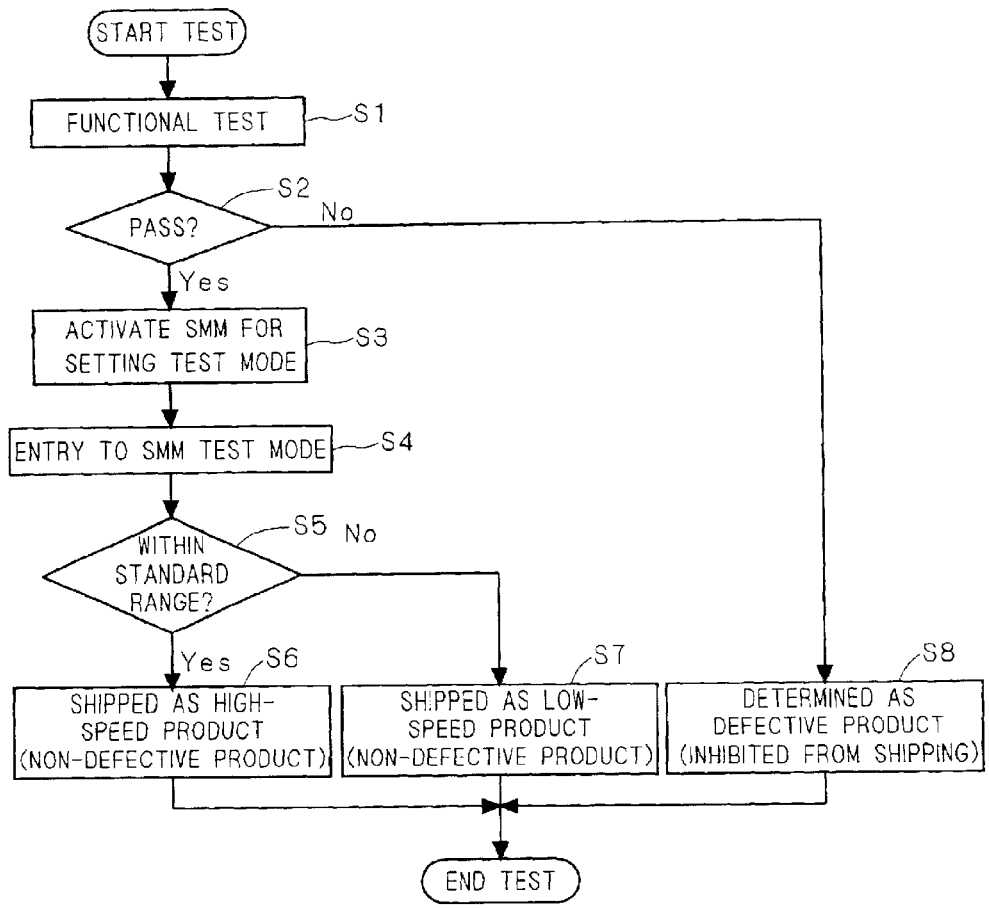
FIG. 19 is a flow chat showing the procedure of an inspection method according to an embodiment 5 of the present invention.
Figure 20:
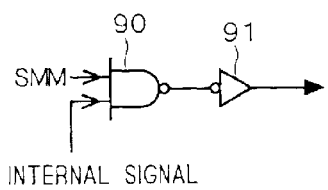
FIG. 20 is a circuit diagram of a conventional semiconductor device.
Figure 21:
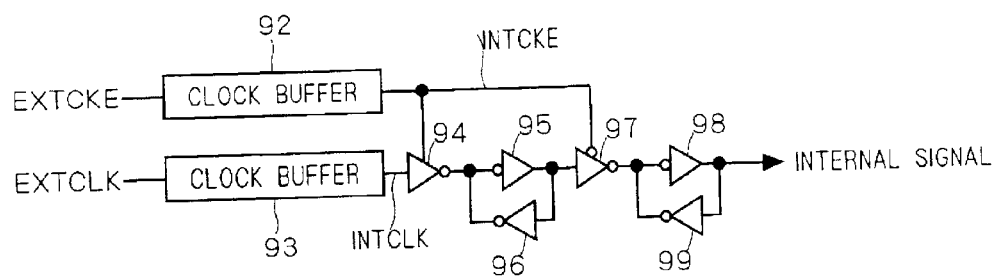
FIG. 21 is a circuit diagram of another conventional semiconductor device.
Figure 22:
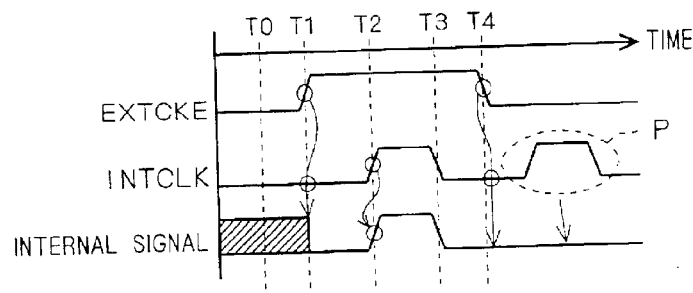
FIG. 22 is an operation waveform diagram of the semiconductor device shown in FIG. 21.

A preferable method of inspecting the semiconductor device according to each of the embodiments 1 to 4 is described as the embodiment 5 of the present invention. FIG. 19 is a flow chart showing the procedure of the preferable inspection method. When processing is started, a generally known functional test is made on the semiconductor device as a product (step S1). When the semiconductor device is determined as passing as the result of the functional test (step S2), the mode switching signal SMM is activated thereby setting the operation mode of the semiconductor device to a test mode (step S3). Then, the signal width of the internal signal is measured (step S4). The signal width is measured by obtaining a Shmoo plot in the aforementioned method.

Then, the signal width is compared with a previously set standard value (step S5). If the signal width is below the standard value, such a determination is made that the inspected product is non-defective and to be shipped as a high-speed product (i.e. a product having a high operating speed) (step S6). If the signal width is not below the standard value, such a determination is made that the inspected product is non-defective and to be shipped as a low-speed product (i.e. a product having a low operating speed) (step S7). When the semiconductor device is determined as defective as the result of the functional test (step S2), such a determination is made that the inspected product is defective and to be inhibited from shipping (step S8). If any of the steps S6 to S8 is terminated, the inspection on the product is ended. The above processing (steps S1 to S8) is repetitively carried out on a number of products.

The processing shown in FIG. 19 can be executed not only on a semiconductor device as a completed product but also on the semiconductor chip 21. Therefore, the processing shown in FIG. 19 can be executed on all types of semiconductor devices described with reference to the embodiments 1 to 4. In relation to the semiconductor device according to the embodiment 4, the signal width may be measured (step S4) as to each of the plurality of semiconductor chips 81 to 84 for determining that the semiconductor device is to be shipped as a high-speed product (step S6) if the signal width is below the standard value (step S5).

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having $M(M \geq 1)$ semiconductor substrates, wherein each of said M semiconductor substrates comprises:

an integrated circuit, a phase comparison circuit comparing phases between an internal signal generated in said integrated circuit and an external signal input from outside said semiconductor device and outputting the result as a monitor signal, and a monitor signal pad for outputting said monitor signal; wherein each of said M semiconductor substrates further comprises a selection circuit selecting one of a plurality of signals generated in said integrated circuit in response to a selection signal and inputting the same in said phase comparison circuit as said internal signal.

2. The semiconductor device according to claim 1, wherein said selection circuit receives at least part of a single or plurality of input signals received in said integrated circuit as said selection signal.

3. The semiconductor device according to claim 1, wherein said selection circuit receives a signal obtained by converting at least part of a single or plurality of input signals received in said integrated circuit as said selection signal.

4. The semiconductor device according to claim 1, wherein each of said M semiconductor substrates further comprises:

a selection signal pad receiving said selection signal.

5. The semiconductor device according to claim 4, further comprising:

a sealing body said M semiconductor substrates, and a selection signal terminal electrically connected to said selection signal pad belonging to each of saidM semiconductor substrates and exposed outward from said sealing body.

6. The semiconductor device having $M(M \geq 1)$ semiconductor substrates, wherein each of said M semiconductor substrates comprises:

an integrated circuit, a phase comparison circuit comparing phases between an internal signal generated in said integrated circuit and an external signal input from outside said semiconductor device and outputting the result as a monitor signal, a monitor signal pad for outputting said monitor signal, a sealing body sealing said M semiconductor substrates, and a monitor signal terminal electrically connected to said monitor signal pad belonging to each of said M semiconductor substrates and exposed outward from said sealing body.

7. The semiconductor device having M $(M \geq 1)$ semiconductor substrates, wherein each of said M semiconductor substrates comprises:

an integrated circuit, a phase comparison circuit comparing phases between an internal signal generated in said integrated circuit and an external signal input from outside said semiconductor device and outputting the result as a monitor signal, and a monitor signal pad for outputting said monitor signal; wherein each of said M semiconductor substrates further comprises:

an external signal pad receiving said external signal; and further comprising:

a sealing body sealing said M semiconductor substrates, and an external signal terminal electrically connected to said external signal pad belonging to each of said M semiconductor substrates and exposed outward from said sealing body.

* * * * *